United States Patent [19]

Manabe et al.

[11] Patent Number: 4,465,715
[45] Date of Patent: Aug. 14, 1984

[54] PROCESS FOR THE PRETREATMENT OF A POLYOLEFIN PRODUCT BEFORE COATING

[75] Inventors: Katsuhide Manabe, Ichinomiya; Yutaka Sato; Ryoichi Muroi, both of Aichi, all of Japan

[73] Assignee: Toyoda Gosei Co., Ltd., Haruhimura, Japan

[21] Appl. No.: 277,972

[22] Filed: Jun. 26, 1981

[30] Foreign Application Priority Data

Jun. 30, 1980 [JP] Japan .................................. 55-88977

[51] Int. Cl.³ .......................... B05D 3/06; B05D 3/10
[52] U.S. Cl. ..................................... 427/444; 427/40; 427/41; 427/307
[58] Field of Search ...................... 427/38, 40, 41, 307, 427/444; 204/165

[56] References Cited

U.S. PATENT DOCUMENTS 3,740,252  6/1973  Chaikin .............................. 427/307
3,829,324  8/1974  Blais et al. .......................... 204/165
3,892,573  7/1975  Tatsuta et al. ..................... 427/40 X

OTHER PUBLICATIONS

Dundas, P. H. and Thorpe, M. L., *Economics and Technology of Chemical Processing with Electric-Field Plasmas*, Chemical Engineering, pp. 123-126, Jun. 30, 1969.

Primary Examiner—Evan K. Lawrence
Attorney, Agent, or Firm—Armstrong, Nikaido, Marmelstein & Kubovcik

[57] ABSTRACT

A process for the pretreatment of a polyolefin product before coating consisting essentially of the steps of treating the surface of the polyolefin product before coating using an organic solvent having a solubility parameter (SP value) equal or similar to that of the polyolefin and subsequently applying a plasma treating thereto in the presence of an active gas by microwave treating the active gas under vacuum. As a result of the process, the surface of the polyolefin product is activated and the adhesion of the coating film is improved.

6 Claims, 2 Drawing Figures

PROCESS FOR THE PRETREATMENT OF A POLYOLEFIN PRODUCT BEFORE COATING

BACKGROUND OF THE INVENTION

The present invention relates to a process for a pretreatment of a polyolefin product before coating, and more particularly, to a pretreatment which permits a significant improvement of the adhesion of coating film.

Polyolefin products, such as polyethylene (hereinafter referred to as "PE") or polypropylene (hereinafter referred to as "PP"), are inexpensive thermoplastic resins which are excellent in chemical resistance and mechanical properties and are widely used in various fields. Polyolefin products, however, have not been widely applied to articles to be coated because of low surface activities and adverse adhesion of coating film.

In the prior art, polyolefin incorporated with an inorganic filler or rubber modifying material was proposed in order to improve the adhesion of coating film. Such incorporation did not always yield satisfactory adhesion and was, therefore, not practicable for automobile parts which are subjected to strict conditions of heat resistance or resistance to gasoline in the adhesion of coating film.

The present invention previously tried to improve the adhesion of coating film of a polyolefin product by performing a plasma treating on the surface of a polyolefin product before coating in the presence of oxygen etc. and activating the surface.

Such process, however, has disadvantages in that a long treating time is required to yield a satisfactory adhesion using only plasma treating and in that the products are apt to be contaminated by dust or oil in manufacturing, resulting in unevenness of the adhesion of coating film in each product.

SUMMARY OF THE INVENTION

An object of this invention is to provide a process for the pretreatment of a polyolefin product before coating wherein the adhesion of coating film on the polyolefin product is improved significantly and the plasma treating time is reduced.

The object is attained by a process consisting essentially of the steps of treating the surface of the polyolefin product before coating with an organic solvent having a solubility parameter (SP value) equal or similar to that of polyolefin and performing the plasma treating thereon in the presence of an active gas. The plasma treating is conducted by microwave treating an active gas under a vacuum.

DETAILED DESCRIPTION OF THE INVENTION

The process for the pretreatment of a polyolefin product before coating according to this invention will now be described in detail.

A product to be coated in this invention is manufactured using polyolefin as hereinafter exemplified by means of injection molding, transfer molding, blow molding, extrusion molding or the like.

Examples of polyolefins are as follows: PE homopolymer, ethylene vinylacetate copolymer, ethylene acrylate copolymer, PP homopolymer, ethylene propylene copolymer, PP with glass fiber, PP with filler, PP with wood flour, PP with paper fiber and PP with rubber.

Figure 1:
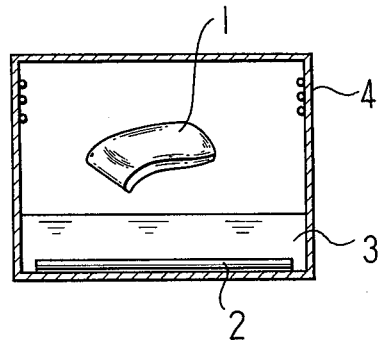
FIG. 1 is a schematic view of a vapor treating device used in process for the pretreatment according to this invention.

A polyolefin product as above manufactured is washed by an organic solvent. Immersion treating may be used, but vapor treating is preferable. This is because the vapor treating always permits the use of organic solvent in high purity, and therefore, the treating efficiency increases. In a vapor treating device as shown in FIG. 1, reference numeral 1 designates a polyolefin product, 2 a heater, 3 an organic solvent, and 4 a cooling pipe. The treating time is usually 10~60 seconds but may be extended up to about 300 seconds if required.

An organic solvent of chlorine or an aromatic compound having an SP value equal or similar to that of polyolefin may be used. Chlorine compounds which are non-combustible can be used more readily than aromatic compounds which are combustible.

Examples of organic solvents of chlorine compounds are as follows: trichloroethlene (9.2), trichlorothane (9.6), dichloroethylene (9.1), ethyl chloride (9.2), pentachloroethylene (9.4), tetrachloroethylene (9.3), methylene chloride (9.7), ethylene dichloride (9.8), and acetyl chloride (9.5), having boiling points ranging from 60°~80° C.

Examples of organic solvent of aromatic compound are as follows: benzene (9.2), toluene (8.9), xylene (8.8), chlorotoluene (8.8) and chlorobenzene (9.5).

In the above examples, each SP value is shown between parentheses, PP has SP value of 9.2~9.4, and PE has an SP value of 7.7~8.3.

Figure 2:
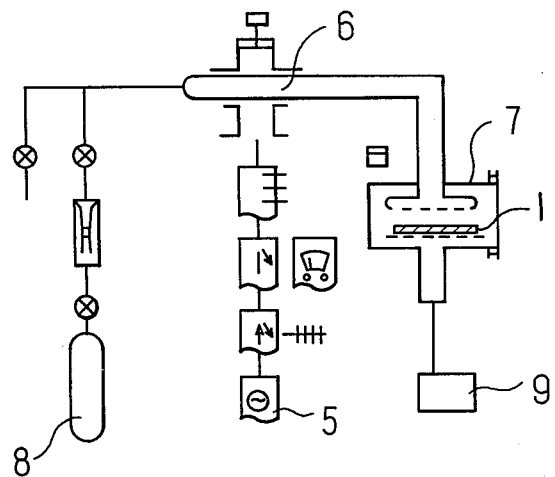
FIG. 2 is a schematic view of a plasma generating device used in process for the pretreatment according to this invention.

The polyolefin product treated by an organic solvent is subjected to the plasma treating using a plasma generating device as shown in FIG. 2 in the presence of an active gas. In FIG. 2, the plasma generating device comprises a microwave oscillator 5, a plasma generating member 6, a treating chamber 7, an oxygen container 8 and vacuum pump 9.

$O_2$ gas is suitable as an active gas but $Br_2$ $NH_3$ $O_3$ or $Cl_2$ gas will do.

Plasma treating conditions are as follows: microwave output 0.2~3.0 KW, oscillating frequency 2,450±50 MHZ, degree of vacuum 0.1~1.0 Torr and treating time 10 seconds or more.

In such a treated polyolefin product the adhesion of the coating is significantly improved so as to be uniform, and the plasma treating time may be reduced to 10~30 seconds.

The reason for the improvement in the adhesion of the coating film is assumed to be as hereinafter described.

Treating of a product using an organic solvent prior to the plasma treating can remove dust or oil stuck on the surface of product and also remove polymers of lower grade, such as the dimer of trimer, which are disposed on the surface layer and cause the reduction of adhesion. Moreover, the solvent treating causes swelling or coarsening of the surface and increases the effective surface area. The plasma treating under such conditions develops the surface activating effect (based on production of C=O group in the case of active gas $O_2$) to an unexpected degree.

Examples embodying the present invention will now be illustrated in comparison to reference examples so as to confirm effects of the invention.

The test specimen is polyethylene-polypropylene copolymer (amount of PE copolymerization: 10~12 wt%) molded in injection molding and cleaned. Dimension of each specimen is 100 mm×100 mm×4 mm t.

A test of physical properties was carried out with respect to three times as hereinafter described. Test results are shown in Table 1.

(a) Peeling strength

The coating film of each specimen was cut into a width of 10 mm. The specimen was held at one end by an adhesive tape and pulled in opposite directions at the pulling speed of 10 mm/min. so that the 180° peeling test was carried out. The universal pulling test instrument "Tensilon UTM-1" of Toyo Sokki Co., Ltd. was used. Three specimens were tested per each example.

(b) Hot water resistance

Each specimen was immeresed in hot water of 40° C. for 240 hours and then tested for peeling strength in a check pattern using an adhesive tape. Two specimens were tested per each example.

(c) Resistance to gasoline

Each specimen was immersed in non-lead gasoline (at room temperature) for 24 hours and then tested for peeling strength in a check pattern using an adhesive tape. Two specimens were tested per each example.

Example 1

In the pretreatment, the starting material was treated using vapor of 1,1,1-trichloroethane at the boiling point (74° C.) for 20 seconds and subsequently treated by plasma for 10 seconds under following conditions.

| plasma treating conditions | |
|---|---|
| microwave output | 1.35 KW |
| oscillation frequency | 2,450 MHz |
| degree of vacuum | 0.5 Torr |
| atmospheric gas | $O_2$ |

The material subjected to the pretreatment was coated with a polyolefin primer (EXP-2179, manufactured by Fujikura Kasei Co., Ltd.) in primer coating (film thickness: 5 μm) and dried in baking, and then coated with one-part acrylic paint (Trade name: Acryline #66E, manufactured by Fujikura Kasei Co., Ltd.) in face coating (film thickness: 15 μm), and thus the test specimen was obtained.

Example 2

Starting material was subjected to the pretreatment in similar manner to Example 1 except for the plasma treating time of 30 seconds and coated with polyolefin primer in primer coating in similar manner to Example 1. After the setting time of several minutes, the material was coated with two-part urethane (R-258H clear, manufactured by Nippon Bee Chemical Co., Ltd.) in face coating (film thickness: 15 μm), and thus the test specimen was obtained.

Example 3

Starting material was subjected to the pretreatment in similar manner to Example 1 and coated with two-part acrylic paint (EXP-2170, manufactured by Fujikura Kasei Co., Ltd.) directly in face coating (film thickness: 15 μm), and thus the test specimen was obtained.

Example 4

Starting material was subjected to the pretreatment in similar manner to Example 2 and coated with two-part polyester urethane (R-257 white, manufactured by Nippon Bee Chemical Co., Ltd.) in primer coating (film thickness: 25 μm). Afteer the setting time of several minutes, the material was coated with two-part urethane (R-258H clear) in face coating (film thickness: 20 μm), and thus the test specimen was obtained.

Example 5

Starting material was subjected to the pretreatment in similar manner to Example 2 and coated with two-part urethane (R-258H clear) directly in face coating (film thickness: 20 μm), and thus the test specimen was obtained.

Example 6

In the pretreatment, starting material was immersed in heated xylene (solvent temperature: 70° C.) for 10 minutes and then the plasma treating was carried out in similar manner to Example 2. The material subjected to the pretreatment was coated in similar manner to Example 5, and thus the test specimen was obtained.

Reference Example 1

The treatment was carried out in similar manner to Example 4 without the plasma treating, and thus the test specimen was obtained.

Reference Example 2

The treatment was carried out in similar manner to Example 4 without the vapor treating, and thus the test specimen was obtained.

Reference Example 3

The treatment was carried out in similar manner to Example 4 except that the plasma treating was carried out and subsequently the vapor treating was carried out, and thus the test specimen was obtained.

Reference Example 4

The treatment was carried out in similar manner to Example 6 without the plasma treating, and thus the test specimen was obtained.

Reference Example 5

The treatment was carried out in similar manner to Example 4 with the immersion treating in mixed liquid of chromic acid and sulphuric acid for 12 minutes in place of the vapor treating, and thus the test specimen was obtained.

Reference Example 6

The treatment was carried out in similar manner to Example 5 without the plasma treating, and thus the test specimen was obtained.

Reference Example 7

The treatment was carried out in similar manner to Example 4 with the flame treating (oxidizing flame of propane gas for 1~5 seconds) in place of the vapor treating, and thus the test specimen was obtained.

From Table 1, it is clearly seen that coating products of Example 1~6 of the present invention are superior in the adhesion of coating to those of Reference Examples 1~7 of other pretreatment.

It is also seen that the adhesion of coating can be improved little by only vapor treating (Reference Example 1), only plasma treating (Reference Example 2) or vapor treating after plasma treating (Reference Example 3). The adhesion of the coating is significantly improved in Example 6 using plasma treating after xylene treating in comparison to Reference Example 4 using only xylene treating. The adhesion of coating is reduced in Reference Example 5 using plasma treating after treating with the mixed liquid of chromic acid and sulphuric acid in comparison to Reference Example 6 using only treating with the mixed liquid of chromic acid and sulphuric acid. Therefore it cannot be always said that the adhesion of coating is improved by the plasma treating after the solvent treating.

TABLE 1

| No. | peeling strength (g/cm) | resistance to hot water | resistance to gasoline |
|---|---|---|---|
| Example 1 | ** | good | good |
| 2 | 905 (824~986) | " | good |
| 3 | ** | " | good* |
| 4 | 905 (824~986) | " | good |
| 5 | 990 (film breakage at more than 990) | " | good* |
| 6 | 857 (780~934) | " | good |
| Reference 1 | 279.5 (256~310) | good | good |
| 2 | 532.5 (527~538) | " | " |
| 3 | 700 (632~767) | " | " |
| 4 | 129.3 (90~170) | 40/100, 40/100 | peeling |
| 5 | 198 (150~278) | 50/100, 0/100 | good |
| 6 | 506 (408~604) | good | " |
| 7 | 665 (610~720) | " | " |

Note: values in parentheses show maximum and minimum
*good after immersion for 100 hours
**not measurable on account of brittleness of film

What is claimed is:

1. A process for the pretreatment of a polyolefin product before coating, said process consisting essentially of steps of treating the surface of the polyolefin product before coating using an organic solvent having a solubility parameter (SP value) equal or similar to that of the polyolefin and subsequently applying a plasma treating thereto in the presence of an active gas,
   wherein said plasma treating is conducted by microwave treating an active gas under a vacuum.

2. A process for the pretreatment of a polyolefin product before coating according to claim 1, wherein said polyolefin product is selected from the group consisting of polyethylene homopolymer, ethylene vinylacetate copolymer, ethylene acrylate copolymer, polypropylene homopolymer and ethylene propylene copolymer.

3. A process for the pretreatment of a polyolefin product before coating according to claim 2, wherein said treating using an organic solvent is vapor treating using an organic solvent of a chlorine compound selected from the group consisting of trichloroethylene, trichloroethane, dichloroethane, ethyl chloride, pentachloroethylene, tetrachloroethylene, methylene chloride, ethylene dichloride and acetyl chloride.

4. A process for the pretreatment of a polyolefin product before coating according to claim 2, wherein said treating using an organic solvent is vapor treating using an organic solvent of an aromatic compound selected from the group consisting of benzene, toluene, xylene, chlorotoluene and chlorobenzene.

5. A process for the pretreatment of a polyolefin product before coating according to claim 3 or 4, wherein said active gas is selected from the group consisting of $O_2$, $Br_2$, $NH_3$, $O_3$ and $Cl_2$.

6. A process for the pretreating of a polyolefin product before coating according to claim 5, wherein said plasma treating is conducted in an apparatus wherein the active gas is microwave treated at a microwave output of 0.2~3.0 Kw and an oscillation frequency of 2,450±50 MHz under a degree of vacuum of 0.1~1.0 Torr, for a treating time of 10~30 seconds.

* * * * *